(12) United States Patent
Li

(10) Patent No.: US 12,543,601 B2
(45) Date of Patent: Feb. 3, 2026

(54) SEMICONDUCTOR OPTOCOUPLER

(71) Applicant: Intematix Corporation, Fremont, CA (US)

(72) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 443 days.

(21) Appl. No.: 18/086,810

(22) Filed: Dec. 22, 2022

(65) Prior Publication Data

US 2023/0275075 A1 Aug. 31, 2023

Related U.S. Application Data

(60) Provisional application No. 63/293,644, filed on Dec. 23, 2021.

(51) Int. Cl.
| | |
|---|---|
| *H01L 25/16* | (2023.01) |
| *H10F 55/00* | (2025.01) |
| *H10F 55/25* | (2025.01) |
| *H10F 55/255* | (2025.01) |
| *H10H 20/841* | (2025.01) |
| *H10H 20/856* | (2025.01) |

(52) U.S. Cl.
CPC .......... *H01L 25/167* (2013.01); *H10F 55/18* (2025.01); *H10F 55/25* (2025.01); *H10F 55/255* (2025.01); *H10H 20/841* (2025.01); *H10H 20/856* (2025.01)

(58) Field of Classification Search
CPC ............................. H01L 25/167; H10F 55/25
See application file for complete search history.

(56) References Cited

U.S. PATENT DOCUMENTS

| | | | |
|---|---|---|---|
| 2010/0117111 A1* | 5/2010 | Illek | H10H 20/841 438/33 |
| 2013/0299841 A1 | 11/2013 | Ranglack et al. | |
| 2014/0084309 A1 | 3/2014 | Yong et al. | |
| 2015/0075607 A1 | 3/2015 | Tischler | |
| 2015/0303356 A1* | 10/2015 | Sanga | H10H 20/856 438/27 |
| 2016/0276327 A1 | 9/2016 | Chang et al. | |
| 2017/0051884 A1 | 2/2017 | Raring et al. | |
| 2020/0152837 A1 | 5/2020 | Vampola et al. | |
| 2024/0113238 A1* | 4/2024 | Arimura | H10F 55/25 |

FOREIGN PATENT DOCUMENTS

JP 2012256683 A 12/2012

OTHER PUBLICATIONS

PCT/IB2022/000776 International Search Report, Jun. 2023.
PCT/IB2022/000776 Written Opinion, Jun. 2023.

* cited by examiner

*Primary Examiner* — Matthew L Reames
(74) *Attorney, Agent, or Firm* — Vista IP Law Group, LLP

(57) ABSTRACT

An optocoupler includes a GaN-based Light Emitting Diode (LED) and a GaN-based photo-detector, where at least one of the LED and photo-detector is a flip chip. In some embodiments, the photo-detector comprises a GaN-based LED configured to operate as a photo-detector.

19 Claims, 13 Drawing Sheets

SECTION A-A

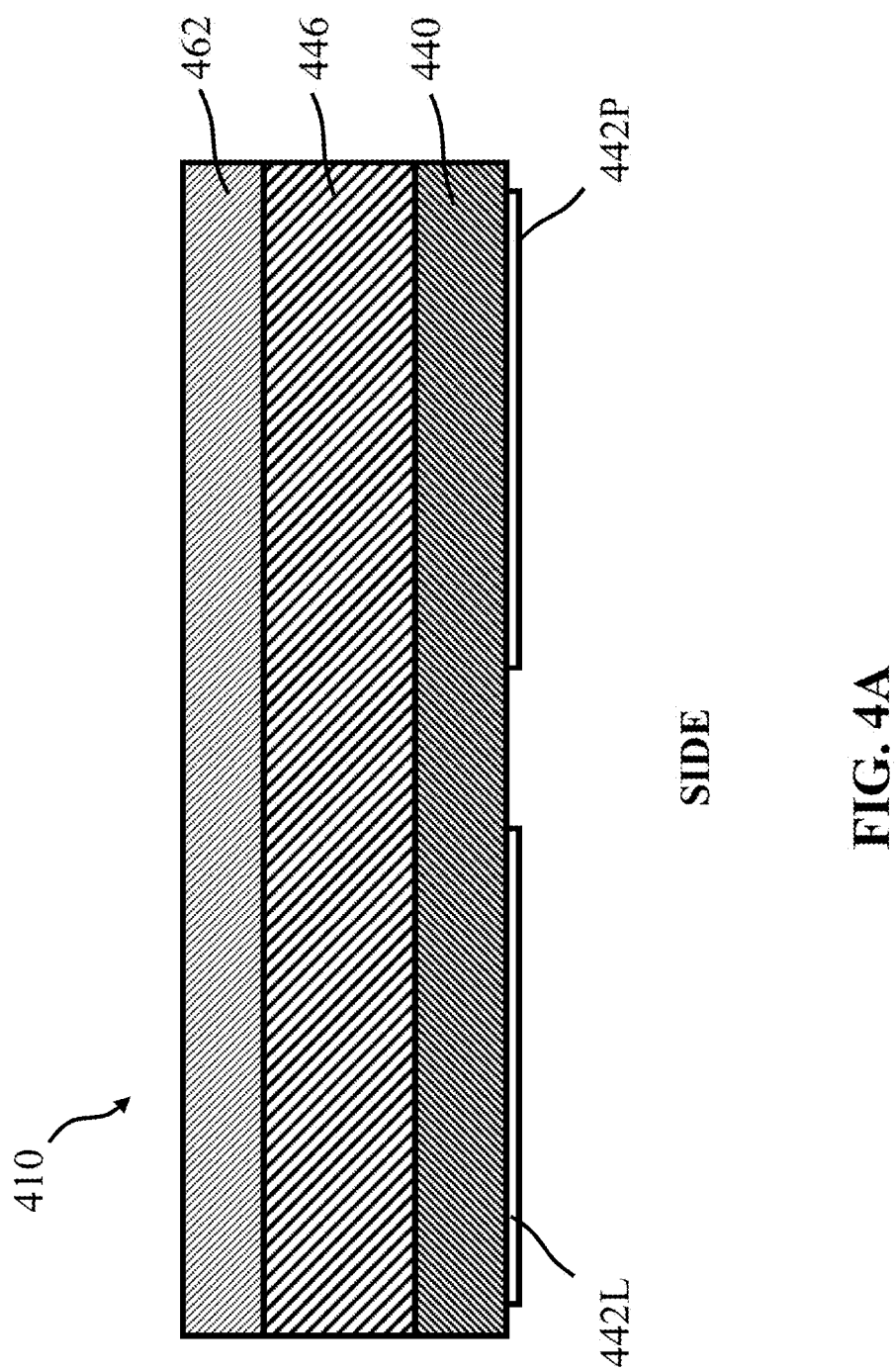

SECTION A-A

SECTION B-B

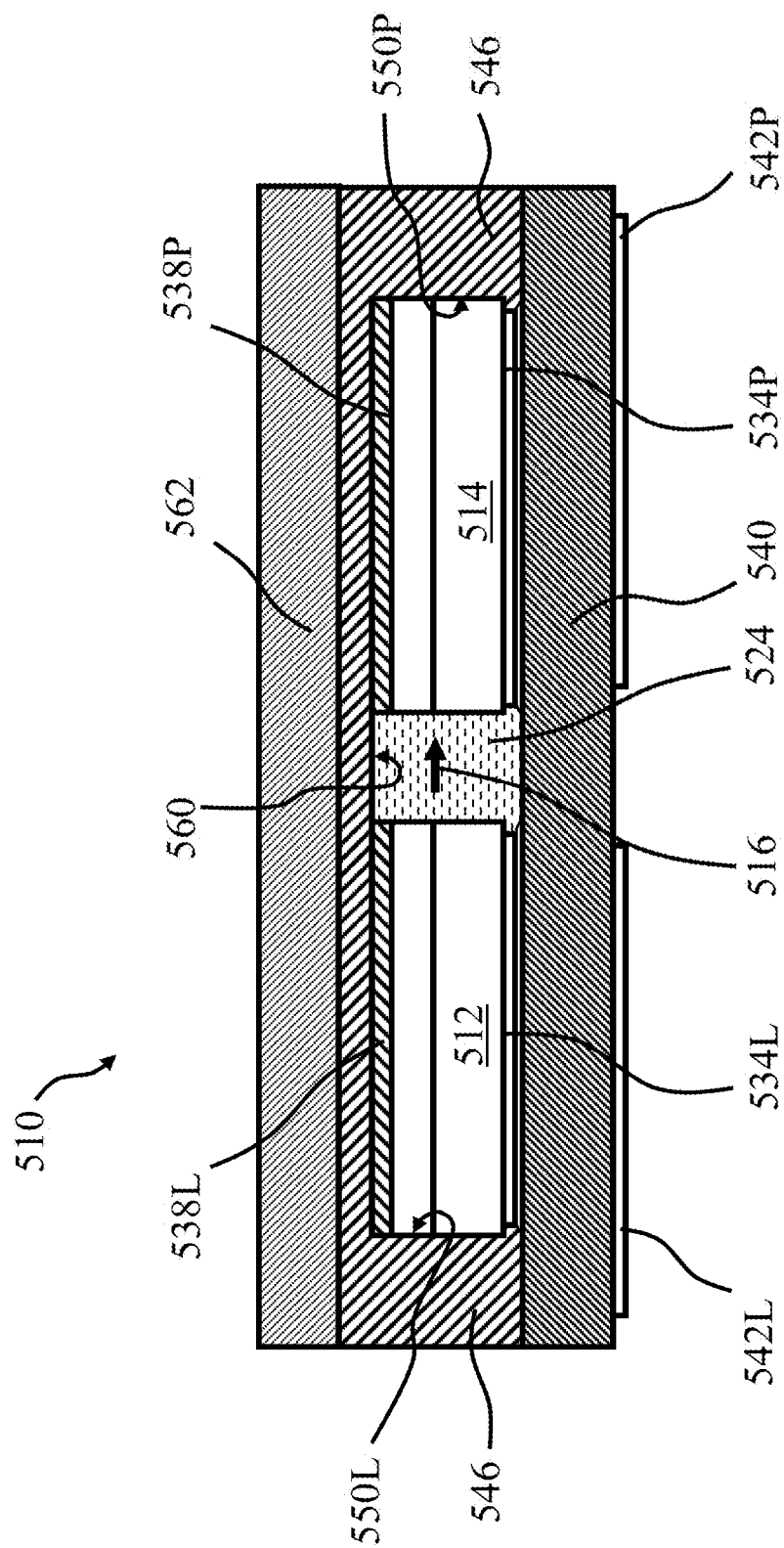

SEMICONDUCTOR OPTOCOUPLER

CROSS REFERENCE TO RELATED APPLICATIONS

This application claims the benefit of priority to U.S. Provisional application No. 63/293,644, filed Dec. 23, 2021, entitled "Semiconductor Optocoupler", which is hereby incorporated by reference in its entirety.

FIELD

This invention relates to optocouplers and in particular semiconductor optocouplers comprising a semiconductor light source, for example an LED (Light Emitting Diode), and a semiconductor photo-detector. More particularly, although not exclusively, embodiments concern improvements in optocoupler packaging arrangements.

BACKGROUND

An optocoupler (also called a photocoupler) is a component that transfers electrical signals between two electrically isolated circuits or systems using an optical (light) signal. Optocouplers are typically used to prevent high voltage surges and high voltage transients (up to 10 kV) induced by electrostatic discharge, lightning and radio frequency transmissions occurring in one circuit from damaging (affecting) another other circuit. The electrical "isolating" characteristic is a major attraction of optocouplers and such devices are generally known as isolating optocouplers, sometimes opto-isolators. Optocouplers are used in a variety of applications including: power electronics, switching power supplies, cell phone chargers, automotive electronics, consumer electronics and industrial automation.

A common type of semiconductor optocoupler is an LED-Photodiode optocoupler that includes an LED (Light Emitting Diode) as a photo-transmitter (source) and a photodiode as a photo-receiver (photo-detector). FIG. 1 is a schematic of an LED-Photodiode optocoupler 110 comprising an LED 112 and a photodiode 114. Light 116 generated by the LED 112 is optically coupled to the photodiode 114 by a light transmissive medium (not shown). The LED 112, photodiode 114, and light transmissive medium are packaged in an opaque package 118. The LED 112 is a gallium arsenide (GaAs) infrared LED and the photodiode 114 is a silicon photodiode with the transfer of electrical signals taking place by means of near infrared light (>760 nm). Other types of photo-detectors can include a phototransistor, opto-triacs, and photo-resistors. Depending on the device construction, optocouplers can have a useful bandwidth (transmission rate) from 30 kHz to about a maximum of 500 kHz.

FIGS. 2A and 2B are schematic cross-sectional representations of known 4-pin dual-in-line packaged (DIP or DIL) LED-Photodiode optocouplers 210. As is known, a DIL package typically includes a rectangular housing 218 having two parallel rows of connecting pins 220 on opposite edges of the housing.

The arrangement of FIG. 2A is referred to as a planar (stack or sandwich) arrangement and can provide voltage isolation up to approximately 2 kV. As shown, the photodiode chip (die) 214 is mounted directly on a lead frame 222 and covered by a thin sheet of light transmissive dielectric material (glass or plastic) 224. The light transmissive sheet 224 is topped by the LED chip (die) 212. The light transmissive sheet 224 provides both electrical isolation and optical coupling between the LED chip 212 and photodiode chip 214. The LED chip 212 and photodiode chip 214 are connected to respective connecting pins 220 of the lead frame by bond wires 226. The breakdown voltage of an insulator is the minimum voltage that causes at least a portion of an insulator to become electrically conductive and the breakdown voltage of the optocoupler 210 depends primarily on the thickness of the light transmissive sheet 224 and the bond wire arrangement.

The arrangement of FIG. 2B is referred to as a dome arrangement and can provide voltage isolation from about 2 kV to 6 kV. As shown, the LED chip 212 and photodiode chip 214 are mounted on opposite edges of the lead frame 222 and are optically coupled to each other by a dome of light transmissive material (e.g. silicone) 224 that fully encapsulates the LED chip 212 and the photodiode chip 214. The remaining volume of the package 218 may be filled with an opaque dielectric material 228 to provide further electrical isolation.

A limitation of known optocouplers is that their large physical size (Footprint of about 35 mm² for a 4-pin DIP) precludes their use in current micro circuit technologies such as HDI PCBs (High Density Interconnector Printed Circuit Boards). Moreover, for micro circuit technology it is desirable to increase the useful bandwidth (operation frequency) of the optocoupler in order to reduce the physical size of optocoupler driver. For example, the higher the operation frequency of the driver the smaller the physical size of components such as capacitors and inductors are required for the driver. The present invention has arisen in an endeavor to provide an optocoupler with an increased useful bandwidth (operation frequency) in the GHz range, an increased operating temperature range, a reduced the footprint size, and reduced overall cost.

SUMMARY OF THE INVENTION

Embodiments of the invention concern optocouplers that use a GaN-based (gallium nitride-based) light source (photo-transmitter) and a GaN-based photo-detectors (photo-receiver) which transfer electrical signals using violet to blue light (about 380 nm to about 495 nm). In this specification, the expression GaN-based includes InGaN-based (indium gallium nitride-based) and GaN/InGaN.

In embodiments, the photo-detector can be constituted by a GaN-based LED that is configured to operate as a photo-detector. In other embodiments, the photo-detector can include a GaN-based photodiode or phototransistor. In embodiments, the LED and/or photo-detector (LED) include a flip chip (die) having electrodes on only a base face which eliminates the need for a lead frame and connecting bond wires. Advantageously, the optocoupler is a Surface Mount Device (SMD) having electrical contacts on its base allowing flip chip bonding of the optocoupler to a circuit.

Embodiments of the invention concern CSP (Chip Scale Packaging) arrangements. In this specification, a CSP arrangement is a packaging arrangement on a chip scale and the packaged device may be comparable in size to the flip chips. Typically, CSP arrangements do not include a lead frame and the chip (die) may themselves comprise a structural component of the package. For example, one or more layers of material can be applied directly to a face, or faces, of the flip chip to form a packaged device. A particular advantage of a CSP arrangement is the small size of the packaged device as compared with DIL packaging arrangements. For example, a CSP optocoupler according to the invention can have a footprint of about 1 mm² to 15 mm².

Particular benefits of optocouplers according to the invention that utilize GaN-based LEDs and GaN-based photo-detectors (e.g. GaN-based LED operated as a photo-detector) is increased operating lifetime (>50,000 hours), higher useful bandwidth (transmission rates) and increased operating temperature range (−55° C. to 150° C.) compared with that of GaAs and silicon devices (≈10,000 hours, up to 500 kHz, −55° C. to 110° C.).

According to an embodiment an optocoupler includes a GaN-based Light Emitting Diode (LED); and a GaN-based photo-detector, wherein at least one of the LED and photo-detector is a flip chip. In embodiments, the photo-detector can include a GaN-based LED configured to operate as a photo-detector.

In embodiments, the LED and the photo-detector may include a flip chip. The LED and photo-detector may include electrode contacts on a bottom face and a reflector covering at least a top face. The reflector can include a Bragg reflector, titanium dioxide ($TiO_2$), magnesium oxide (MgO), or barium carbonate ($BaCO_3$).

The optocoupler may include a light transmissive medium disposed between a light-emitting side face of the LED flip chip and a light-receiving side face of the photo-detector flip chip. The light transmissive medium may include a silicone material, an epoxy material, glass, or sapphire.

The optocoupler can further include a light reflective material layer that covers and is in direct contact with side and top faces of the LED, the photo-detector, and the light transmissive medium. The light reflective material layer can include: a Bragg reflector or a layer comprising particles of titanium dioxide ($TiO_2$), magnesium oxide (MgO), and/or barium carbonate ($BaCO_3$).

The optocoupler can further include an opaque material layer that covers the light reflective material layer. The opaque material layer can include a silicone or an epoxy material.

In embodiments, the LED generates violet to blue light with a peak emission wavelength from 380 nm to 495 nm.

Advantageously, the optocoupler has an operation frequency of at least 1 MHz, preferably at least 10 MHz. The optocoupler may have a maximum operating temperature of at least 130° C.

According to another aspect, an optocoupler includes a GaN-based Light Emitting Diode (LED); a GaN-based photo-detector; and a light transmissive medium that optically couples light between the LED and photo-detector, wherein the optocoupler has an operation frequency of at least 1 MHz and preferably at least 10 MHz.

According to a further aspect, an optocoupler includes a first GaN-based Light Emitting Diode (LED) chip configured to receive an electrical signal and generate violet to blue light; and a second GaN-based Light Emitting Diode (LED) chip configured to receive violet to blue light from the first GaN based LED chip and generate an electrical signal.

According to a yet further aspect, an optocoupler includes a GaN-based Light Emitting Diode (LED); a GaN-based photo-detecting diode; and a sapphire substrate, wherein the GaN-based LED and GaN-based photo-detecting diode are monolithically fabricated on the sapphire substrate.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 4A to 4F are schematic representations of an SMD (Surface Mount Device) optocoupler according to an embodiment of the invention in which FIG. 4A shows a side view, FIG. 4B shows an end view, FIG. 4C shows a top view, FIG. 4D shows a bottom view, FIG. 4E shows a sectional side view through A-A, and FIG. 4F shows a sectional bottom through B-B;

FIG. 5 is a sectional side view through A-A of an SMD (Surface Mount Device) optocoupler according to an embodiment of the invention;

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
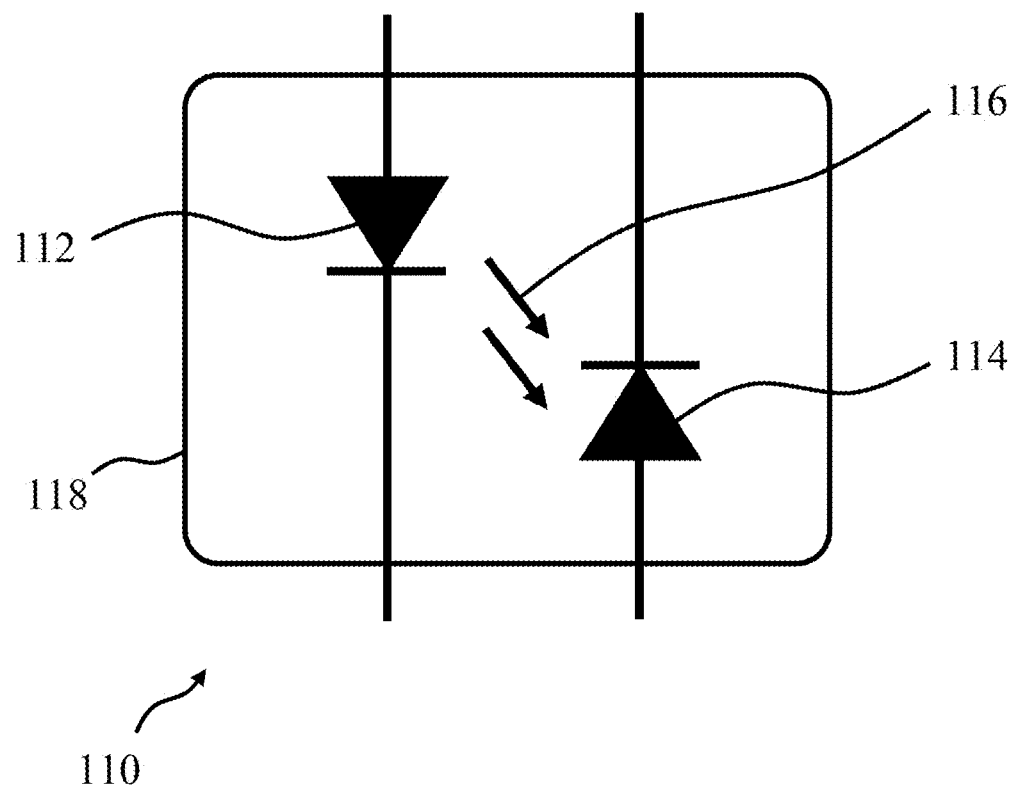
FIG. 1 is a schematic of an LED-Photodiode optocoupler.
Figure 2A:
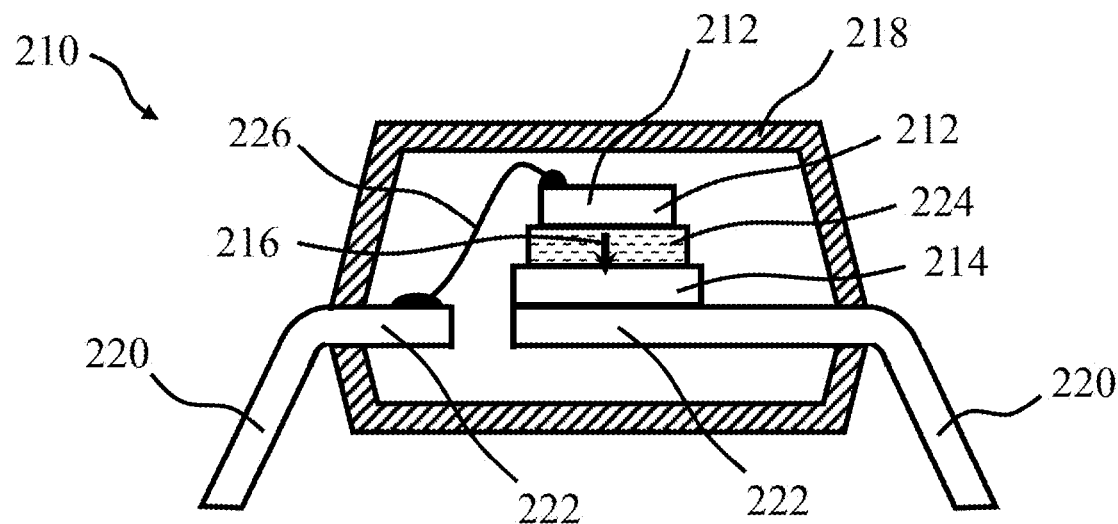
FIGS. 2A and 2B are schematic cross-sectional representations of known dual-in-line (DIL) packaged LED-Photodiode optocouplers.
Figure 2B:
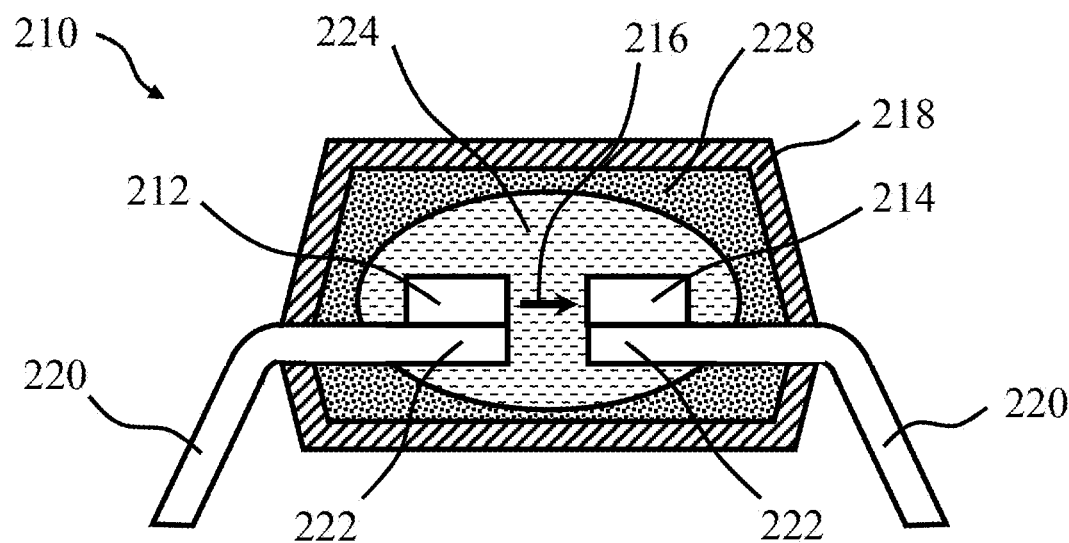

Throughout this specification, like reference numerals are used to denote like parts with the reference numeral being preceded by the figure number #. For example, an optocoupler #10 is referenced as 110 in FIG. 1, 210 in FIG. 2 and so forth.

Figure 3A:
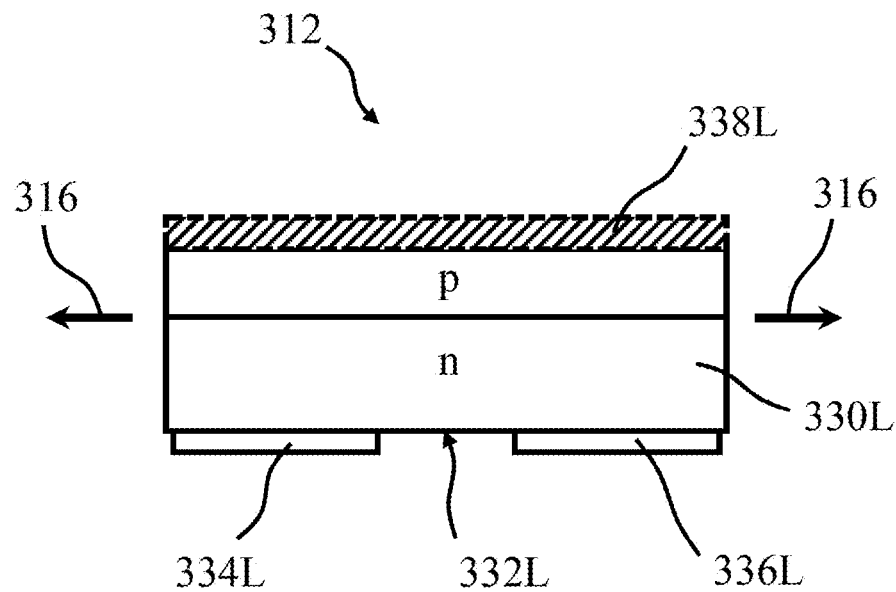
FIG. 3A is a schematic side view of an LED flip chip.
Figure 3B:
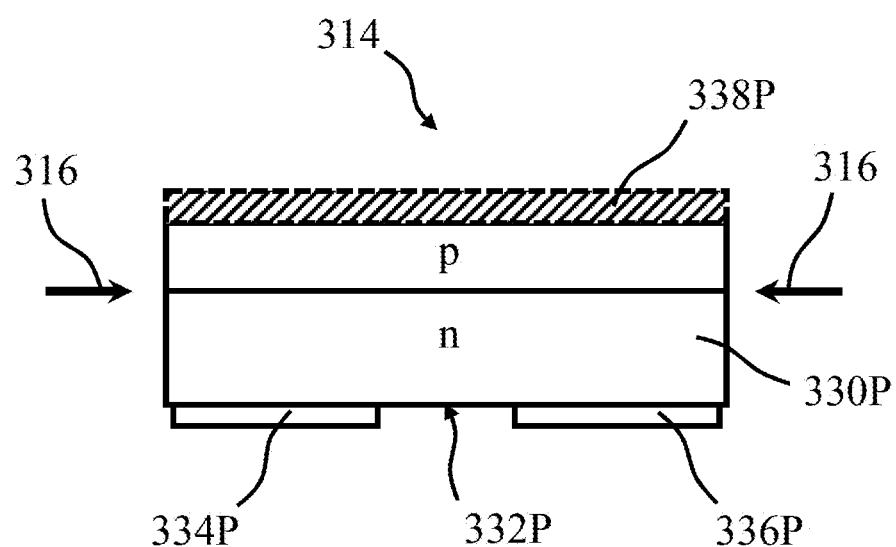
FIG. 3B is a schematic side view of a photo-detector flip chip.

As disclosed herein, embodiments of the invention concern optocouplers that use GaN-based (including InGaN-based) LEDs and GaN-based photo-detectors that operate with light in the violet to blue region (about 380 nm-about 495 nm) of the visible spectrum. In some embodiments, the LED and/or photo-detector include a flip chip (die). FIG. 3A is a schematic side view of a GaN-based LED flip chip 312 and FIG. 3B is a schematic side view of a GaN-based photo-detector flip chip 314. It is to be noted that the structures of the LED flip chip 312 and photo-detector flip chip 314 are essentially identical and differ only in their mode of operation with the LED converting an electrical signal into an optical signal (light) 316 and the photo-detector converting an optical signal 316 into an electrical signal. It will be appreciated that an LED can be operated as a photodiode and vice versa. In the drawings, parts of the LED flip chip 312 are followed the letter "L" and parts of the photo-detector flip chip 314 are followed by the letter "P". Since the LED and photo-detector are structurally identical, and for the sake of brevity, only the LED flip chip 312 of FIG. 3A is described in detail, though it will be appreciated that the description applies equally to the photo-detector flip chip 314 of FIG. 3B.

The LED flip chip 312 generates violet to blue light 316 with a peak emission wavelength from about 380 nm to about 495 nm. The LED flip chip 312 includes a GaN, InGaN or InGaN/GaN chip (die) 330L having on its base face 332L (lower face as illustrated) anode and cathode chip pads 334L, 336L. Optionally, as illustrated, the LED flip chip 312 may have on an opposite top light emitting face (upper face as illustrated) a reflector 338L. The reflector 338L prevents the emission of light from the top face of the LED and confines light 316 emission to the side (edge) faces of LED chip 312. The reflector 338L can include a multi-layer dielectric reflector such as for example a Distributed Bragg Reflector (DBR)/Bragg Reflector. In embodiments the reflector 338L may be constituted by, or further include, a cladding material layer whose index of refraction n is lower than that of GaN, that is lower than about 2.3. The cladding material can include a silicone material with an index of refraction of 1.4 to 1.6. With a reflector and/or cladding layer, the LED flip chip 312 operates as an edge-emitting LED flip and the photo-detector 314 operates as an edge-receiving photodiode. It will be appreciated that light emission from the LED flip chip may, in addition to the directions indicated in the figure (i.e. left and right), also occur from the side faces of the chip in directions in and out of the plane of the figure and/or from the top face of LED chip when a reflector is not present.

Figure 4B:
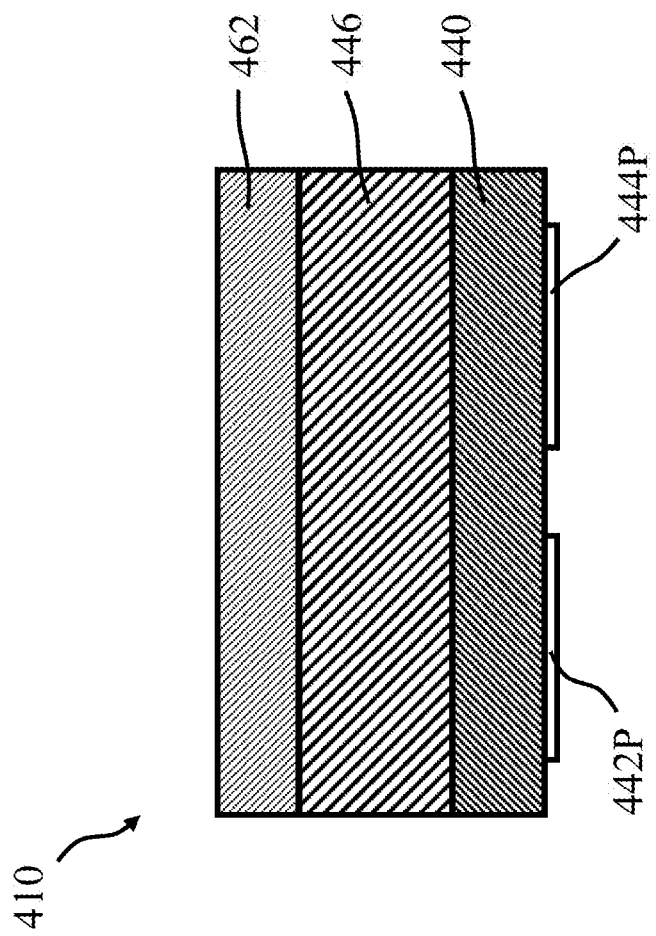
Figure 4C:
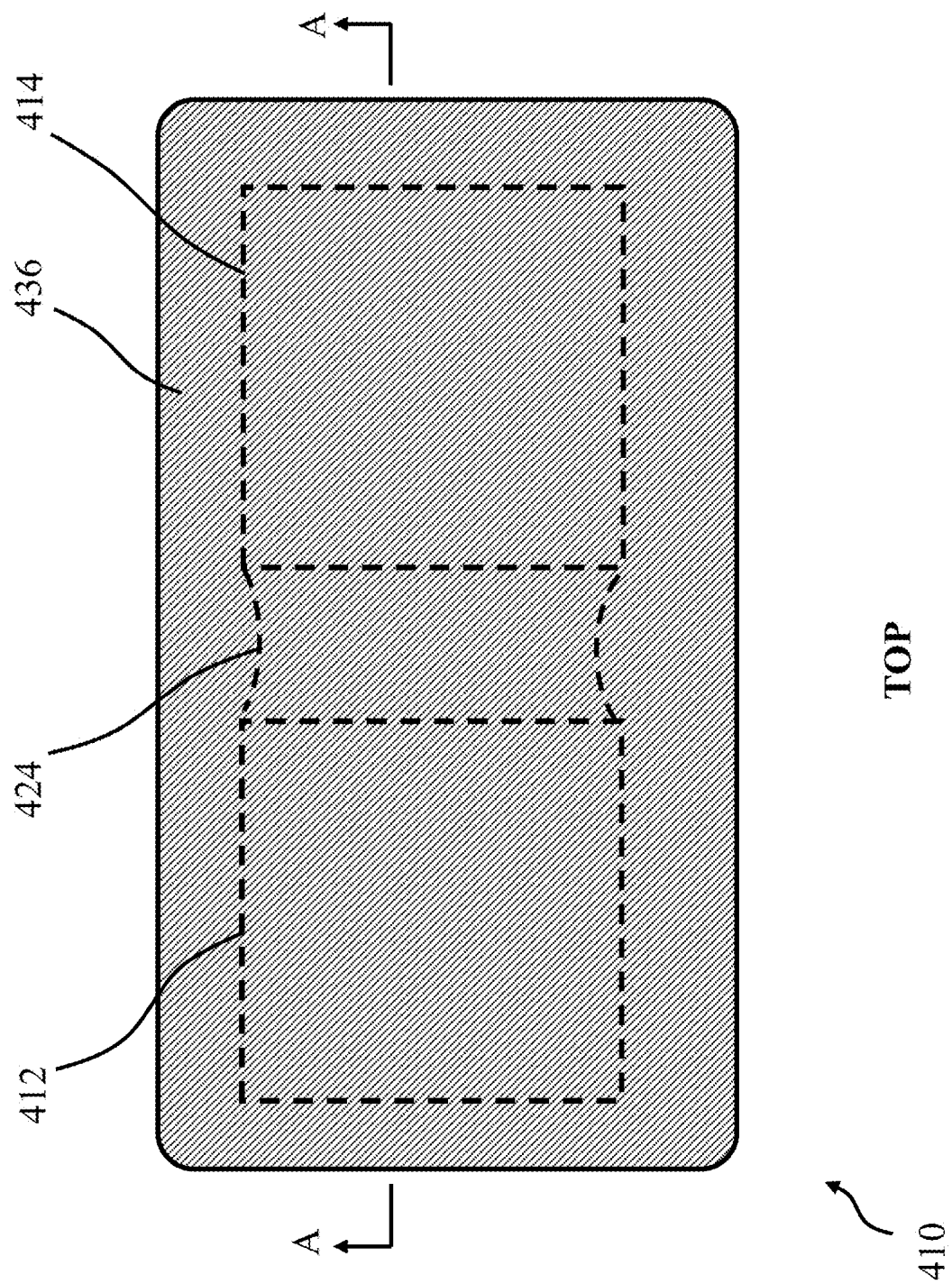
Figure 4D:
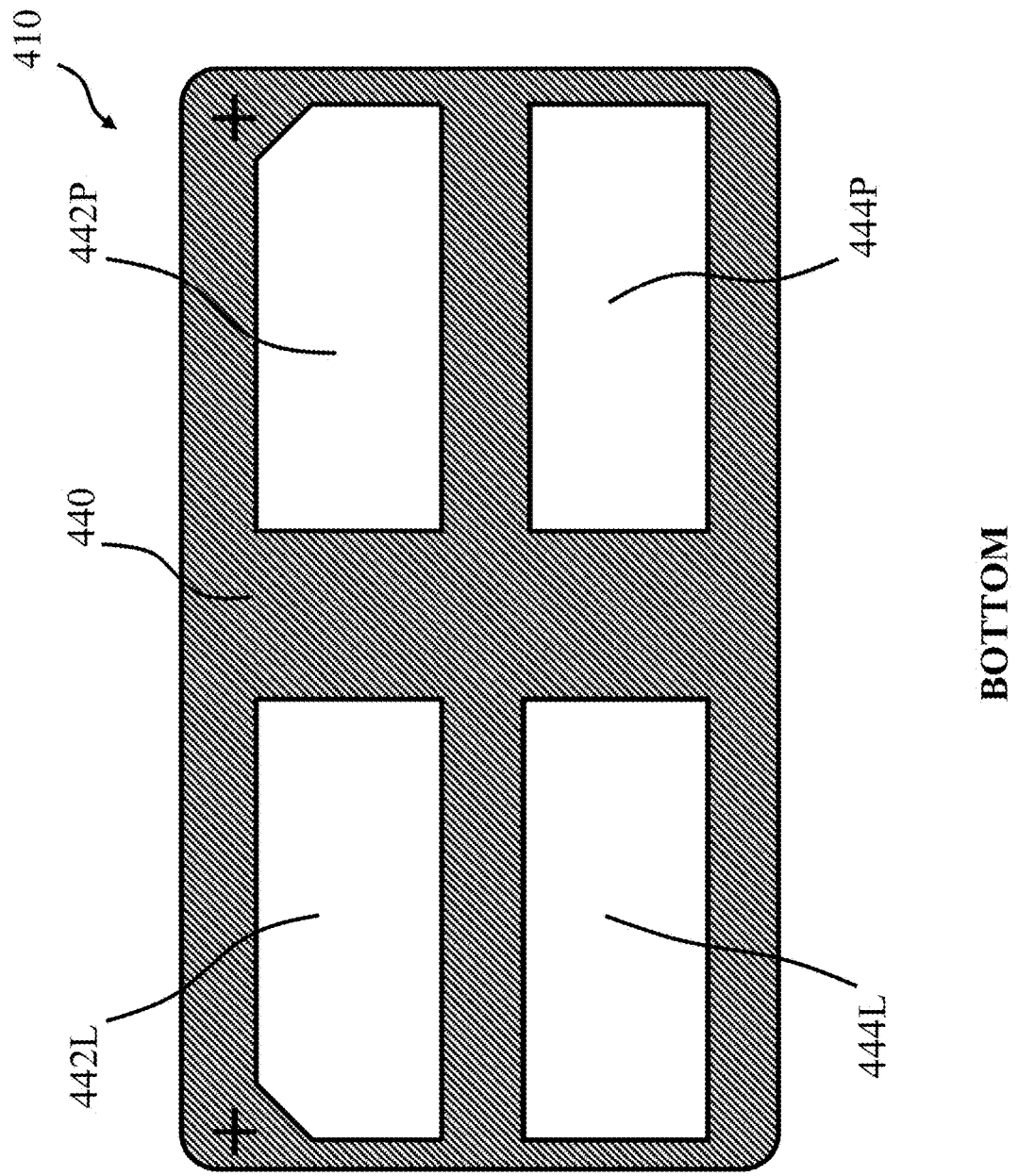
Figure 4E:
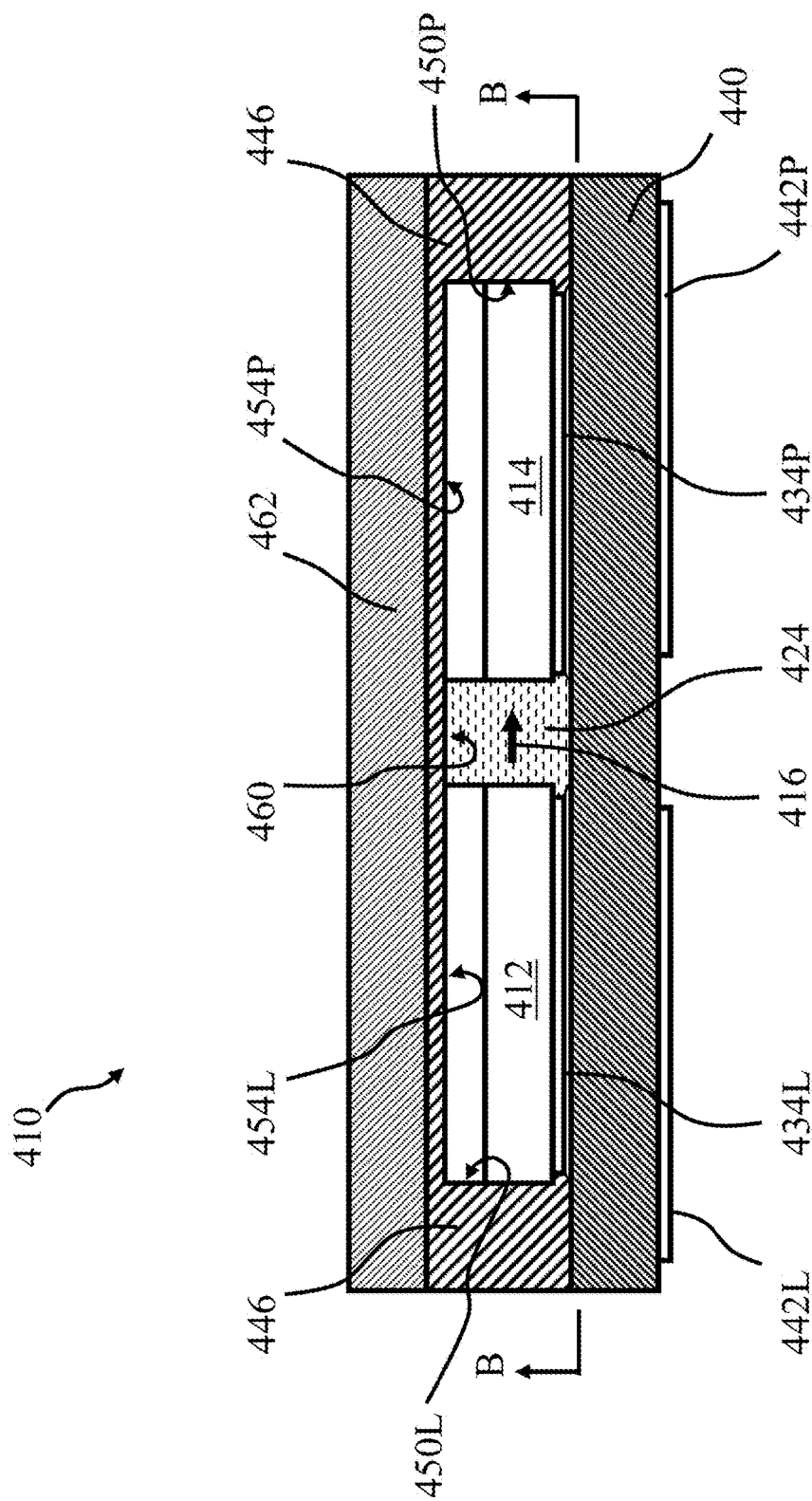
Figure 4F:
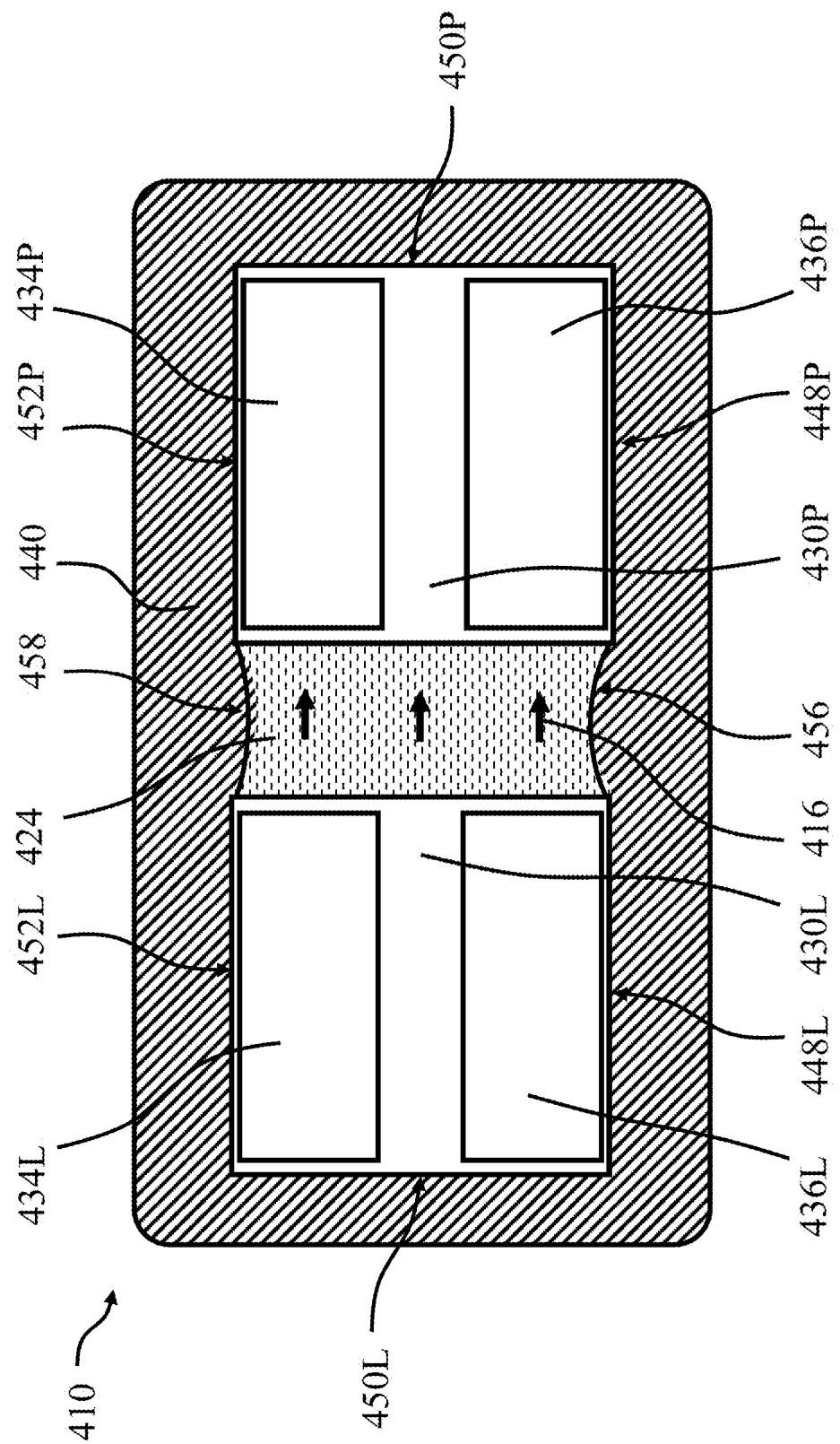

FIGS. 4A to 4F are schematic representations of an SMD (Surface Mount Device) Chip Scale Packaged (CSP) optocoupler 410 according to an embodiment of the invention in which FIG. 4A shows a side view, FIG. 4B shows an end view, FIG. 4C shows a top view, FIG. 4D shows a bottom view, FIG. 4E shows a sectional side view through A-A, and FIG. 4F shows a sectional bottom view through B-B. As can be seen in FIG. 4E, the optocoupler 410 includes a submount (substrate) 440, for example a printed circuit board, having an LED flip chip 412 and photo-detector flip chip 414 mounted on, and electrically connected to, a top face (upper as illustrated). The LED flip chip 412 and photo-detector flip chip 414 are mounted in a spaced (separated) relation on the submount 440 with a light-emitting side face (right hand as illustrated) of the LED flip chip 412 aligned with a light-receiving side face (left hand as illustrated) of the photo-detector flip chip 414. The space between the light-emitting side face of the LED flip chip and light-receiving side face of the photo-detector is filled with a light transmissive medium 424, such as, for example, a clear silicone or epoxy material. In this specification, light transmissive means at least partially light transmissive and encompasses fully transparent to translucent. In embodiments, the light transmissive medium 424 may include glass or sapphire. The light transmissive medium 424 may include an optical waveguide (lightguide) that may have an optical cladding layer on its outer surface to confine light within the lightguide. The LED flip chip 412 and photo-detector flip chip 414 are configured such that light 416 generated by the LED flip chip 412 is optically coupled to the photo-detector flip chip 414 by means of the light transmissive medium 424.

The submount 440 can include, on a bottom face (lower as illustrated), LED anode and cathode contact pads 442L, 444L and photo-detector anode and cathode contact pads 442P, 444P (FIG. 4D). The LED anode and cathode chip pads 434L, 436L are electrically connected to a corresponding LED anode and cathode contact pads 442L, 444L. The photo-detector anode and cathode chip pads 434P, 436P are electrically connected to a corresponding photo-detector anode and cathode contact pads 442P, 444P.

The optocoupler 410 may further include a layer of light reflective material 446 that is in direct contact with and covers: i) the three remaining side faces 448L, 450L, 452L (FIG. 4F) and top face 454L (FIG. 4E) of the LED flip chip 412, ii) the three remaining side faces 448P, 450P, 452P (FIG. 4F) and top face 454P (FIG. 4E) of the photo-detector flip chip 414, and the two side faces 456, 458 (FIG. 4F) and top face 460 (FIG. 4E) of the light transmissive material 424. The light reflective material 446 can include a white silicone or white epoxy material and is configured to prevent emission of light from the side faces of the optocoupler by confining light to be within the LED flip chip, photo-detector flip chip and light transmissive material. The white silicone or white epoxy may particles of light reflective titanium dioxide ($TiO_2$), magnesium oxide (MgO), and/or barium carbonate ($BaCO_3$). In embodiments, the light reflective material 446 can include a multilayer dielectric reflector such as, for example, a Distributed Bragg Reflector (DBR)/Bragg Reflector. In embodiments, the light reflective material 446 may be constituted by, or further include, a cladding material layer whose index of refraction n is lower than that of GaN, i.e. is lower than about 2.3. The cladding material can include a silicone material with an index of refraction of 1.4 to 1.6.

The optocoupler can further include a layer of opaque material 462, for example a black epoxy or black silicone material, that covers the light reflective material layer 446. The opaque layer 462 is configured to prevent light emission from the top surface of the optocoupler.

FIG. 5 is a sectional side view through A-A of an SMD (Surface Mount Device) optocoupler 510 according to an embodiment of the invention that utilizes an edge-emitting LED flip chip 512 and edge-receiving photo-detector 514. In this embodiment, the LED flip chip 512 includes a reflector 538L and the photo-detector flip chip 514 includes a reflector 538P on their top surface. As illustrated, the layer of light reflective material 546 is in direct contact with and covers: the three side faces and top face of the LED flip chip 512 and photo-detector flip chip 514, and the two side faces and top face 560 of the light transmissive material 524. In other embodiments, the layer of light reflective material can cover only the three side faces of the LED flip chip 512 and photo-detector flip chip 514 and the two side faces of the light transmissive material 524.

Optocouplers according to embodiments of the invention can be manufactured by: mounting the LED and photo-detector flip chips on the submount by flip chip bonding; dispensing a light transmissive material (e.g. epoxy, silicone or curable polymer material) to fill the space between adjacent side faces of the LED and photodiode flip chips and then curing the light transmissive material; dispensing a light reflective material (e.g. white epoxy, silicone or curable polymer material) to form a layer that covers the external side and top faces of the LED and photodiode flip chips and the side and top face of the light transmissive material and then curing the light reflective material; and dispensing an opaque material (e.g. black epoxy, silicone or curable polymer material) to form a layer that cover the light reflective layer and then curing the opaque material. It will be appreciated that multiple optocouplers can be manufactured on a single substrate comprising an array of submounts and then dividing the substrate into individual opto-couplers by, for example, dicing.

Optocouplers in accordance with the invention find utility in a variety of applications including: power electronics, switching power supplies, cell phone chargers, automotive electronics, consumer electronics and LED lighting. Preliminary tests indicate that GaN-based LEDs/photo-detector optocouplers according to embodiments of the invention have a number of benefits as compared with known optocouplers comprising GaAs LEDs and silicon photodiodes. First, is their superior operating lifespan (life expectancy) of greater than 50,000 hours as compared with approximately 10,000 hours for the known optocouplers. Such an extended life span can be particularly beneficial in LED lighting applications where it is required that the LED lamp has a similar operating life expectancy. Second, is their higher operation frequency of at least 1 MHz as compared with about up to 500 kHz. Initial tests have shown successful operation frequencies of 10 MHz and it is expected that operation frequencies of up to 100 MHz are possible. Third is their extended operating temperature range −55° C. to 125° C. compared with that of GaAs and silicon devices of −50° C. to 110° C. Again, such an extended operating temperature range can be particularly beneficial in LED lighting applications where it is required that the LED lamp has a similar operating temperature range.

In embodiments utilizing Chip Scale Packaging (CSP), such as for example those in FIGS. 4A to 4F and FIG. 5, the overall package size is primarily determined by the size of the LED/Photodiode chips (dies). For example, for such a device comprising 40 mil×40 mil (1 mm×1 mm) chips, the overall size (footprint) of the device is about 7 mm$^2$ as compared with a footprint of about 35 mm$^2$ for a known 4-pin DIP optocoupler. A further advantage of CSP optocoupler is that due to the simple nature of the packaging arrangement, optocouplers can be manufactured very inexpensively compared with known packaging arrangements.

Test Results

Figure 6:
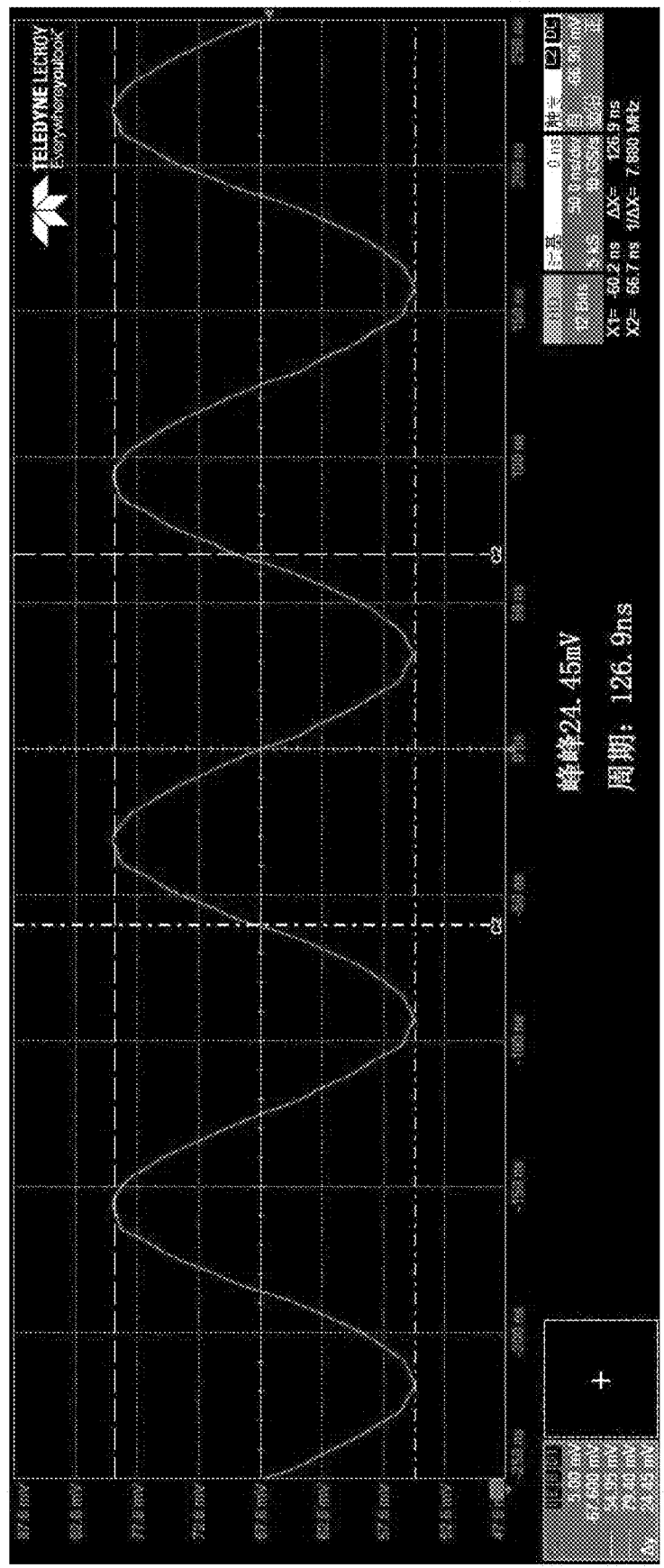
FIG. 6 is a measured output from an optocoupler according to the invention.

FIG. 6 shows the measured output from a CSP packaged optocoupler according to an embodiment of the invention. The optocoupler essentially has the packaging arrangement shown in FIGS. 4A to 4F and includes two 40 mil×40 mil (1 mm×1 mm) GaN-based LED flip chips. The optocoupler has a footprint size of about 7 mm$^2$. The optocoupler was driven from a Siglent SDG1025 waveform generator with a 24 mA, 8 MHz sine wave and the output was measured by LeCroy HDO4104A Oscilloscope as shown in FIG. 6.

Monolithic CSP Optocoupler

While the foregoing embodiments have been described as utilizing discrete flip chips, optocoupler in accordance with the invention lend themselves to monolithically fabricated devices in which the LED and photo-detector are monolithically fabricated on a common substrate such as sapphire. In such arrangements, the sapphire substrate constitutes the light transmissive medium that couples light between the LED and photo-detector. Such a structure can significantly improve the optical coupling efficiency of light between the LED and photo-detector and reduce subsequent packaging steps.

Figure 7:
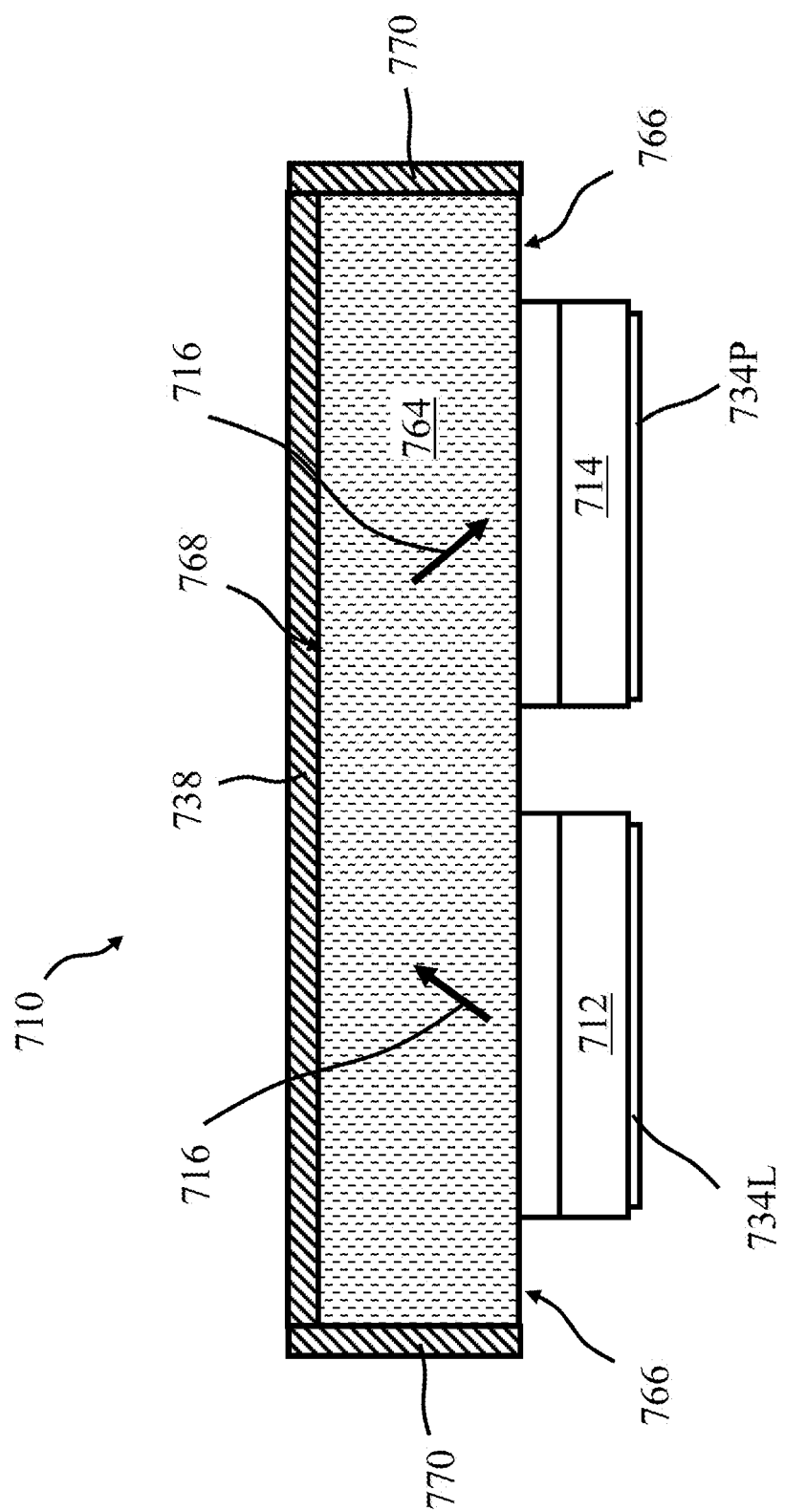
FIG. 7 is a schematic representation of a monolithic optocoupler according to an embodiment of the invention.

FIG. 7 is a schematic representation of a monolithic optocoupler 710 according to an embodiment of the invention. The optocoupler 710 includes a sapphire substrate 764 having on a first face 766 (lower as shown) a monolithically fabricated LED flip chip 712 and a photo-detector flip chip 714. In such an arrangement, the sapphire substrate 764 constitutes a light transmissive medium and couples light 716 between the LED flip chip 712 and photo-detector flip chip 714. On an opposite face of the sapphire substrate 768 (upper as shown) there may be provided a reflector 738 that covers the upper face 768 of the substrate 764. The reflector 738 prevents the emission of light from the upper face of the optocoupler 710. The reflector 738 can include a multilayer dielectric reflector such as for example a Distributed Bragg Reflector (DBR)/Bragg Reflector. Optionally, as indicated in FIG. 7, the optocoupler 710 can include a reflector 770 that covers each of the four side faces of the sapphire substrate 764. The reflector 770 can include a layer of light reflective material, for example silver, or a multilayer dielectric reflector such as for example a Distributed Bragg Reflector (DBR)/Bragg Reflector.

Figure 8:
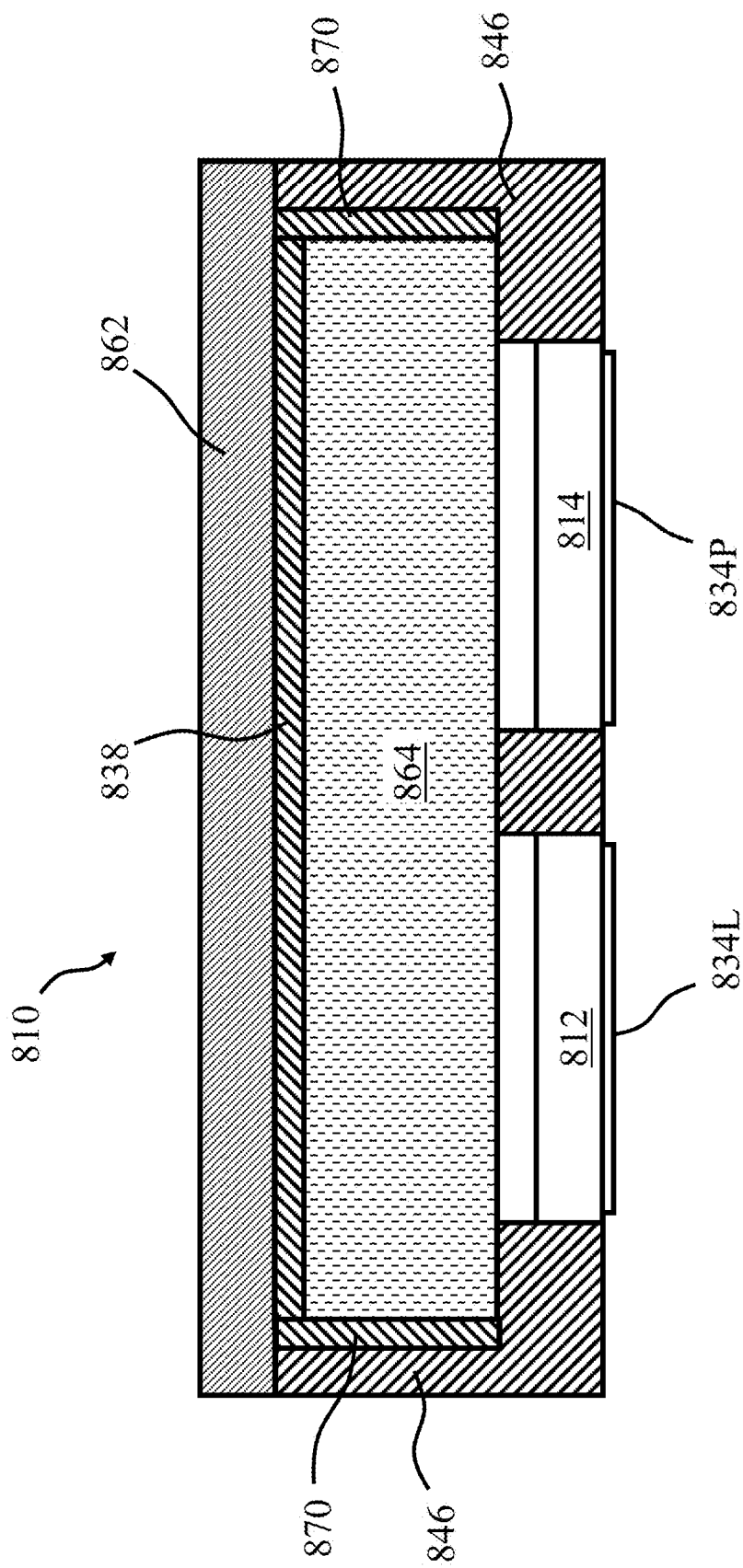
FIG. 8 is a sectional side view of a Chip Scale Packaged (CSP) monolithic optocoupler according to an embodiment of the invention.

FIG. 8 is a sectional side view of a Chip Scale Packaged (CSP) monolithic optocoupler according to an embodiment of the invention. In this embodiment a monolithic optocoupler (e.g. monolithic optocoupler 710—FIG. 7) further include a layer of light reflective material 846 that is in direct contact with and covers the four side faces of the monolithic optocoupler. The light reflective material 846 can include a white silicone or white epoxy material and is configured to prevent emission of light from the side faces of the optocoupler 810 by confining light to the sapphire substrate 864. The white silicone or white epoxy may particles of light reflective titanium dioxide ($TiO_2$), magnesium oxide (MgO), and/or barium carbonate ($BaCO_3$). The optocoupler 810 can further include a layer of opaque material 862, for example a black epoxy or black silicone material, that covers the reflector 838 on the upper surface of the sapphire substrate. The opaque layer 862 is configured to prevent light emission from the top surface of the optocoupler 810.

While the foregoing embodiments have been described as utilizing CSP (Chip Scale Packaged) a technology, it will be appreciated that optocouplers in accordance with the invention comprising GaN-based LEDs and photo-detectors find utility in other packaging arrangements such as those utilizing a lead frame.

As used in this document, both in the description and in the claims, and as customarily used in the art, the words "substantially," "approximately," and similar terms of approximation are used to account for manufacturing tolerances, manufacturing variations, manufacturing imprecisions, and measurement inaccuracy and imprecision that are inescapable parts of fabricating and operating any mechanism or structure in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. Therefore, the invention is not to be restricted or limited except in accordance with the following claims and their legal equivalents.

LIST OF REFERENCE NUMERALS (#=FIGURE NO., L=LED, AND P=PHOTODIODE)

10 Optocoupler
12 LED
14 Photodiode
16 Light
18 Package
20 Connecting pins
22 Lead frame
24 Light transmissive medium
26 Bond wire
28 Opaque dielectric material
30L LED chip (die)
30P Photo-detector Chip (die)
32L Base face of LED chip (die)
32L Base face of photo-detector chip (die)
34L LED anode chip pad
34P Photo-detector anode chip pad
36L LED cathode chip pad
36P Photo-detector cathode chip pad
38L LED reflector
38P Photo-detector reflector
40 Submount (substrate)
42L LED anode contact pad
42P Photo-detector anode contact pad
44L LED cathode contact pad
44P Photo-detector cathode contact pad
46 light reflective material layer
48L LED flip chip side face
50L LED flip chip side face
52L LED flip chip side face
54L LED flip chip top face
48L Photo-detector flip chip side face
50L Photo-detector flip chip side face
52L Photo-detector flip chip side face
54L Photo-detector flip chip top face
56 Light transmissive material side face
58 Light transmissive material side face
60 Light transmissive material top face
62 Opaque material
64 Sapphire substrate
66 First (lower) face of sapphire substrate
68 Opposite (upper) face of sapphire substrate
70 Reflector on side face(s) of sapphire substrate

What is claimed is:
1. A Chip Scale Packaged (CSP) optocoupler comprising:
a GaN-based Light Emitting Diode (LED);
a GaN-based photo-detector;
a light transmissive medium disposed between the LED and the photo-detector for coupling light therebetween; and
a light reflective material configured to prevent emission of light from the optocoupler,
wherein the light reflective material is in direct contact with at least one of the LED, the photo-detector, and the light transmissive medium;
wherein the LED and the photo-detector is a flip chip.

2. The optocoupler of claim 1, wherein the photo-detector comprises a photo-detecting diode, a phototransistor, or a second GaN-based LED.

3. The optocoupler of claim 1, wherein the LED and photo-detector comprise electrode contacts on a bottom face and a reflector on at least a top face.

4. The optocoupler of claim 3, wherein the reflector comprises a multilayer dielectric reflector or a Bragg reflector.

5. The optocoupler of claim 1, wherein the light transmissive medium comprises at least one of: a silicone material, an epoxy material, glass, or sapphire.

6. The optocoupler of claim 1, wherein the light reflective material covers and is in direct contact with side faces of: the LED, the photo-detector, and the light transmissive medium.

7. The optocoupler of claim 1, wherein the light reflective material comprises at least one of: titanium dioxide ($TiO_2$), magnesium oxide (MgO), barium carbonate ($BaCO_3$), or a cladding material with an index of refraction of less than 2.3.

8. The optocoupler of claim 1, comprising an opaque material layer that covers the light reflective material.

9. The optocoupler of claim 1, wherein the LED is for generating violet to blue light with a peak emission wavelength in a range from 380 nm to 495 nm.

10. The optocoupler of claim 1, wherein the optocoupler has an operation frequency of at least 1 MHz.

11. The optocoupler of claim 1, wherein the optocoupler has an operation frequency of at least 10 MHz.

12. The optocoupler of claim 1, wherein the optocoupler has a maximum operating temperature of at least 130° C.

13. The optocoupler of claim 1, wherein the light transmissive medium comprises a sapphire substrate and wherein the LED and photo-detector are monolithically fabricated on the sapphire substrate.

14. A Chip Scale Packaged (CSP) optocoupler comprising:
a GaN-based Light Emitting Diode (LED):
a GaN-based photo-detector;
a sapphire substrate for coupling light between the LED and the photo-detector; and
a light reflective material configured to prevent emission of light from the optocoupler;
wherein the GaN-based LED and GaN-based photo-detector are monolithically fabricated on a bottom face of the sapphire substrate;
wherein the light reflective material is in direct contact with at least one of the LED, the photo-detector, and the sapphire substrate;
wherein the LED and the photo-detector is a flip chip.

15. The optocoupler of claim 14, wherein the light reflective material covers and is in direct contact with a top face of the sapphire substrate.

16. The optocoupler of claim 14, wherein the light reflective material covers and is in direct contact with side faces of the sapphire substrate.

17. The optocoupler of claim 14, wherein the light reflective material covers and is in direct contact with side faces of the LED and the photo-detector.

18. The optocoupler of claim 14, wherein the light reflective material comprises at least one of: titanium dioxide ($TiO_2$), magnesium oxide (MgO), barium carbonate ($BaCO_3$), or a cladding material with an index of refraction of less than 2.3.

19. The optocoupler of claim 14, comprising an opaque material layer that at least partially covers the light reflective material.

\* \* \* \* \*